United States Patent
Hatcher et al.

(10) Patent No.: US 10,153,368 B2
(45) Date of Patent: Dec. 11, 2018

(54) UNIPOLAR COMPLEMENTARY LOGIC

(71) Applicant: Samsung Electronics Co., Ltd., Suwon-si, Gyeonggi-do (KR)

(72) Inventors: Ryan M. Hatcher, Austin, TX (US); Rwik Sengupta, Austin, TX (US); Chris Bowen, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/656,898

(22) Filed: Jul. 21, 2017

(65) Prior Publication Data

US 2018/0254350 A1 Sep. 6, 2018

Related U.S. Application Data

(60) Provisional application No. 62/465,319, filed on Mar. 1, 2017.

(51) Int. Cl.
*H03K 19/20* (2006.01)
*H01L 29/78* (2006.01)
*H01L 27/11* (2006.01)

(52) U.S. Cl.
CPC .... *H01L 29/78391* (2014.09); *H01L 27/1104* (2013.01); *H03K 19/20* (2013.01)

(58) Field of Classification Search
CPC .............. H03K 19/20; H01L 27/1104; H01L 29/78391
USPC ...................................................... 326/119
See application file for complete search history.

(56) References Cited

U.S. PATENT DOCUMENTS

| | | | | |
|---|---|---|---|---|
| 5,923,184 A * | 7/1999 | Ooms | ..................... | H03K 19/08 326/121 |
| 6,025,735 A | 2/2000 | Gardner et al. | | |
| 6,233,169 B1 * | 5/2001 | Nishimura | .............. | G11C 11/22 365/145 |
| 6,314,016 B1 * | 11/2001 | Takasu | ..................... | G11C 11/22 326/49 |
| 6,498,742 B2 * | 12/2002 | Chu | ........................ | G11C 11/22 257/E29.272 |
| 6,949,780 B2 | 9/2005 | Ueda et al. | | |
| 7,795,923 B1 * | 9/2010 | Wu | ........................ | H03K 19/20 326/104 |
| 8,089,108 B2 | 1/2012 | Wilson et al. | | |
| 8,159,873 B2 * | 4/2012 | Takahashi | ............... | G11C 11/22 365/182 |
| 8,362,604 B2 | 1/2013 | Ionescu | | |
| 9,484,924 B2 | 11/2016 | Shin et al. | | |
| 2016/0322368 A1 | 11/2016 | Sun et al. | | |

OTHER PUBLICATIONS

Phillips et al., "Measurement and Analysis of a Ferroelectric Field-Effect Transistor NAND Gate," Sep. 2009, 2 pages, Internet URL: https://ntrs.nasa.gov/search.jsp?R=20090037681.

* cited by examiner

*Primary Examiner* — Don Le
(74) *Attorney, Agent, or Firm* — Lewis Roca Rothgerber Christie LLP

(57) ABSTRACT

A system of unipolar digital logic. Ferroelectric field effect transistors having channels of a first polarity, are combined, in circuits, with simple field effect transistors having channels of the same polarity, to form logic gates and/or memory cells.

19 Claims, 11 Drawing Sheets

Gated D latch truth table

| E/C | D | Q | Q̄ | Comment |
|---|---|---|---|---|
| 0 | X | $Q_{prev}$ | $\bar{Q}_{prev}$ | No change |
| 1 | 0 | 0 | 1 | Reset |
| 1 | 1 | 1 | 0 | Set |

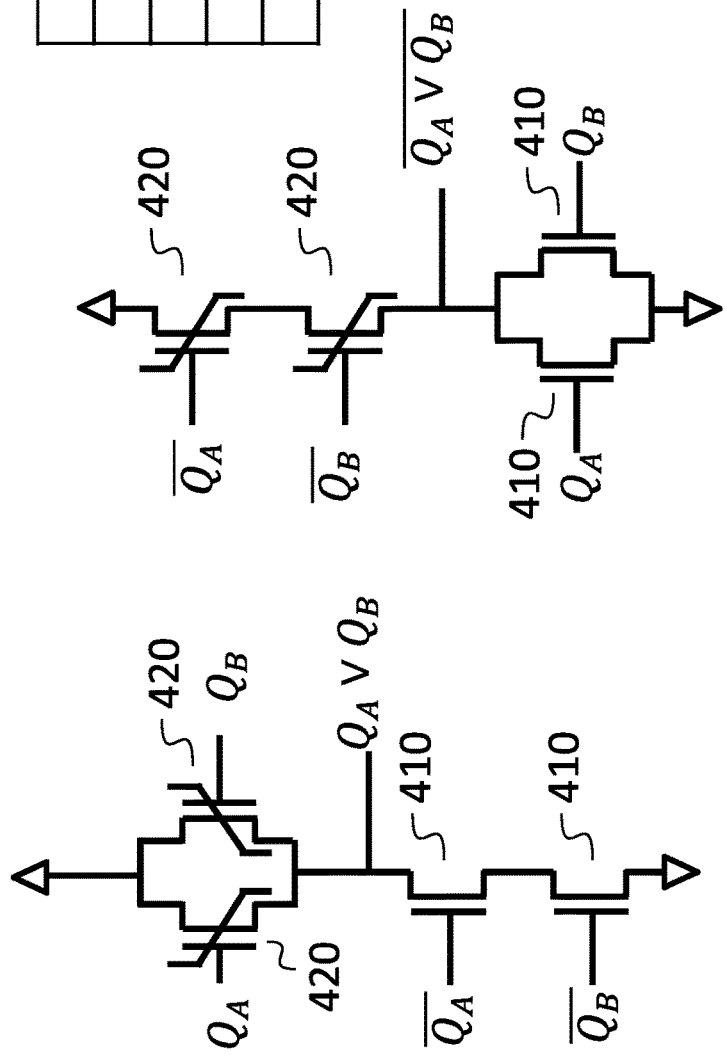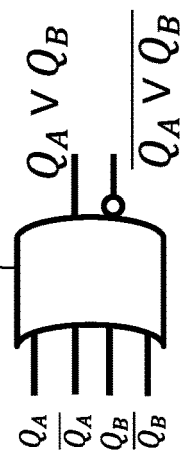
FIG. 6D
FIG. 6C
FIG. 6B
FIG. 6A

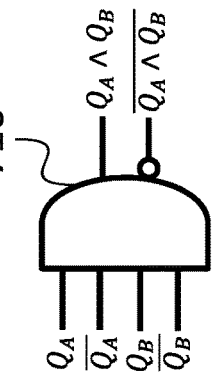
| $Q_A$ | $Q_B$ | $Q_A \wedge Q_B$ | $\overline{Q_A \wedge Q_B}$ |
|---|---|---|---|
| 0 | 0 | 0 | 1 |
| 0 | 1 | 0 | 1 |
| 1 | 0 | 0 | 1 |
| 1 | 1 | 1 | 0 |
*FIG. 7D*
*FIG. 7C*
*FIG. 7E*
$$\overline{A} \wedge B = \overline{A \vee B}$$
$$\overline{A} \vee \overline{B} = \overline{A \wedge B}$$
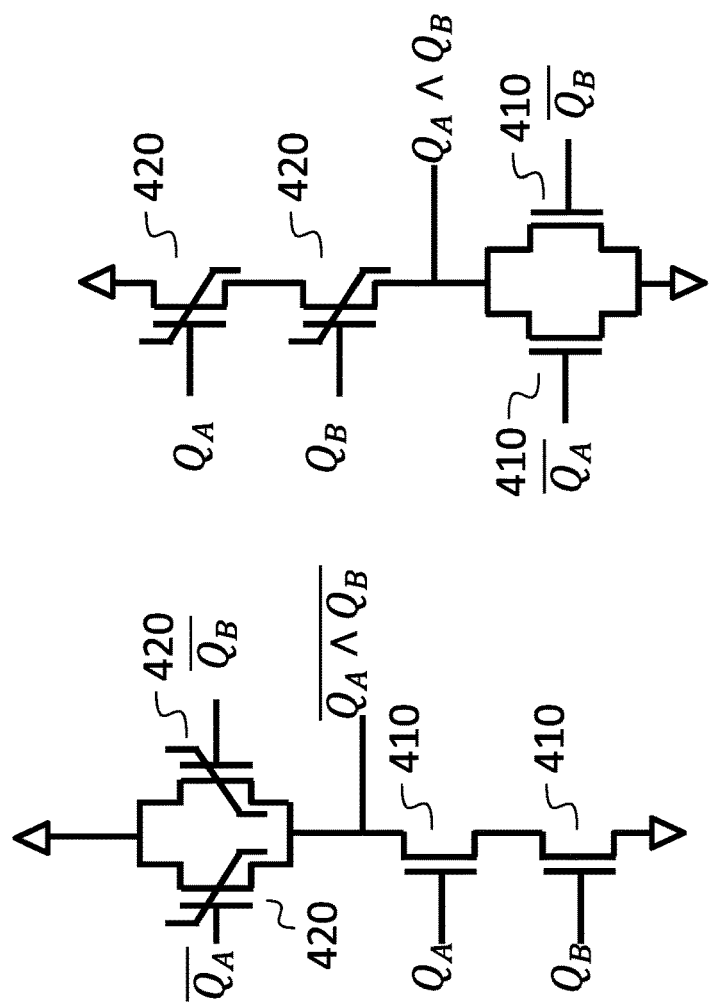
*FIG. 7A*
*FIG. 7B*

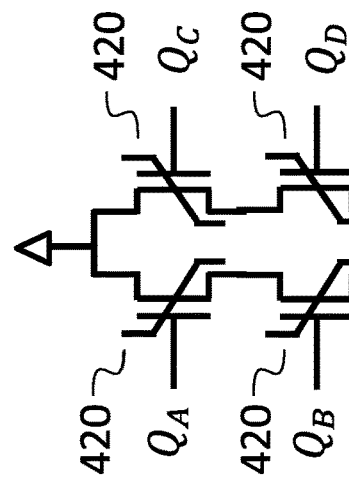
FIG. 8C
$$Q_{out} = \overline{(Q_A \wedge Q_B) \vee (Q_C \wedge Q_D)}$$
FIG. 8D
| $Q_A$ | $Q_B$ | $Q_C$ | $Q_D$ | $Q_{out}$ |
|---|---|---|---|---|
| 0 | x | 0 | x | 1 |
| 0 | x | x | 0 | |
| x | 0 | 0 | x | |
| x | 0 | x | 0 | |
| 1 | 1 | 0 | x | 0 |
| 1 | 1 | x | 0 | |
| 0 | x | 1 | 1 | 0 |
| x | 0 | 1 | 1 | 0 |
| 1 | 1 | 1 | 1 | 0 |
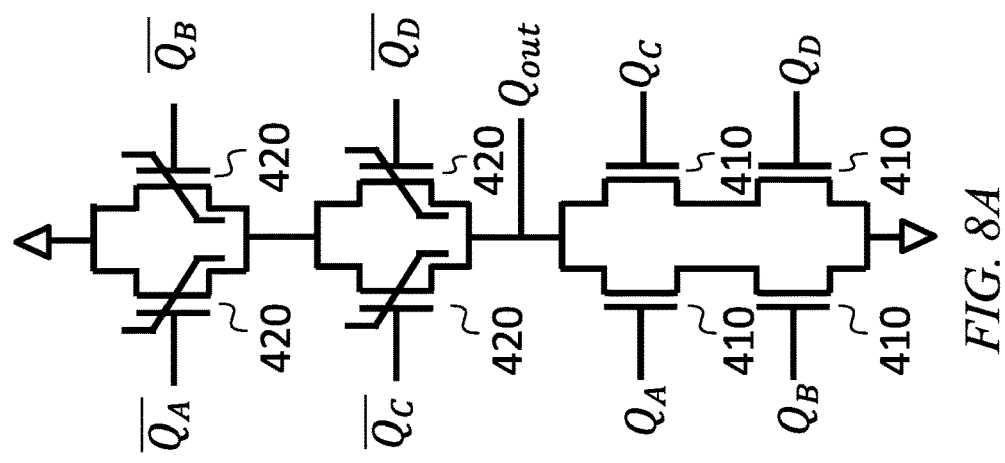
FIG. 8A
FIG. 8B

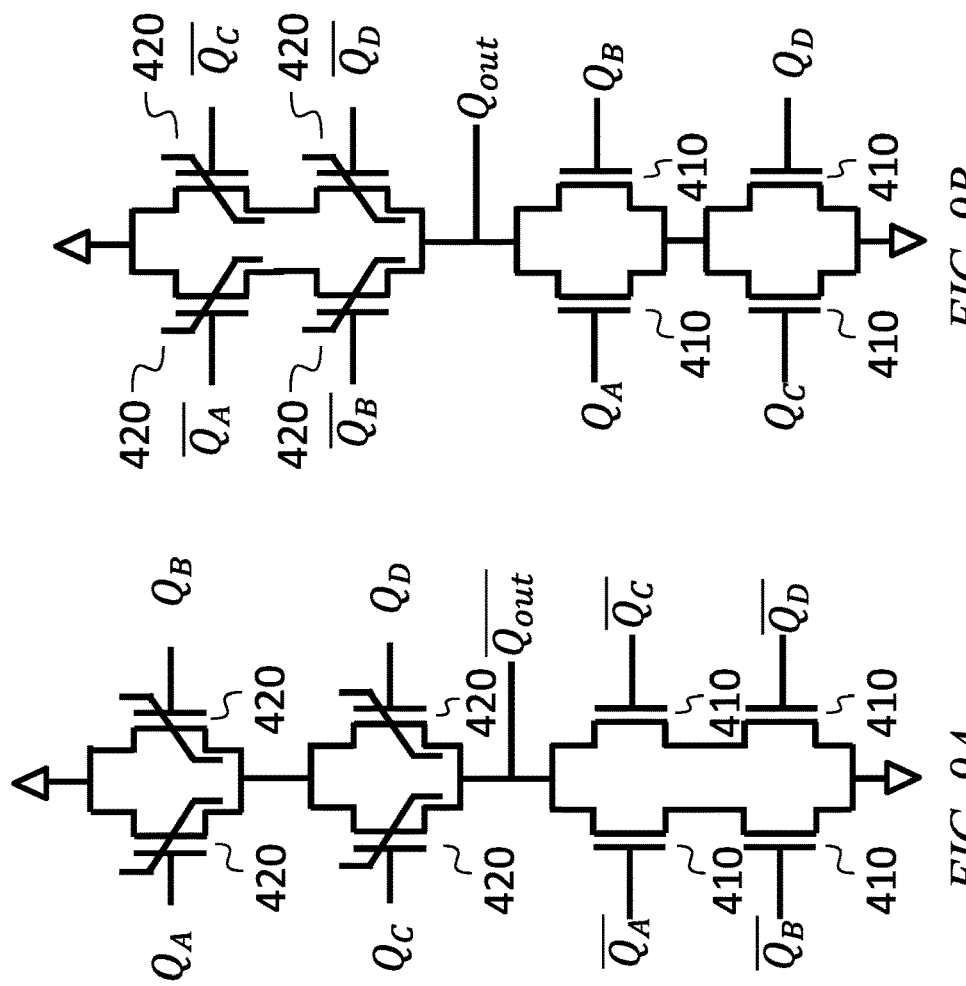

UNIPOLAR COMPLEMENTARY LOGIC

CROSS-REFERENCE TO RELATED APPLICATION(S)

The present application claims priority to and the benefit of U.S. Provisional Application No. 62/465,319, filed Mar. 1, 2017, entitled "UNIPOLAR COMPLEMENTARY LOGIC", the entire content of which is incorporated herein by reference.

FIELD

One or more aspects of embodiments according to the present invention relate to digital circuits, and more particularly to digital circuits constructed entirely of n-type or entirely of p-type transistors.

BACKGROUND

Static complementary logic, such as complementary metal oxide semiconductor (CMOS) logic, is commonly used in integrated circuits. One significant challenge associated with fabricating complementary logic is that it requires both n-type and p-type transistors to be integrated together in the same flow. This requirement for both types of transistors introduces additional cost and complexity in the manufacturing process.

Thus, there is a need for a kind of logic that does not require both n-type and p-type transistors.

SUMMARY

Aspects of embodiments of the present disclosure are directed toward a system of unipolar digital logic. Ferroelectric field effect transistors having channels of a first polarity, are combined, in circuits, with simple field effect transistors having channels of the same polarity, to form logic gates and/or memory cells.

According to an embodiment of the present invention there is provided an integrated circuit including: a plurality of field effect transistors, each of the field effect transistors of the integrated circuit having a channel of a first polarity, the plurality of field effect transistors including: a first field effect transistor; and a second field effect transistor, the first field effect transistor being a simple field effect transistor, and the second field effect transistor being a ferroelectric field effect transistor.

In one embodiment, the channel of the first polarity is an n-type channel.

In one embodiment, the channel of the first polarity is an n-type channel, and a source of the first field effect transistor is connected to a first power supply voltage.

In one embodiment, a source of the second field effect transistor is connected to a second power supply voltage, greater than the first power supply voltage.

In one embodiment, the integrated circuit includes a buffer-inverter including the first field effect transistor and the second field effect transistor.

In one embodiment, the integrated circuit includes a logic gate configured to provide an AND function.

In one embodiment, the logic gate has: a first input for a first input signal; a second input for a second input signal; a third input for an input signal that is a complement of the first input signal; and a fourth input for an input signal that is a complement of the second input signal.

In one embodiment, the logic gate has: a first output for a first output signal; and a second output for an output signal that is a complement of the first output signal.

In one embodiment, the logic gate is further configured to provide an OR function.

In one embodiment, the logic gate is further configured to provide a NOR function.

In one embodiment, the integrated circuit includes a logic gate configured to provide an AND-OR-invert function.

In one embodiment, the logic gate is further configured to provide an OR-AND-invert function.

In one embodiment, the integrated circuit includes a memory cell configured to provide a static random access memory cell function.

In one embodiment, the integrated circuit includes a memory cell configured to provide a data flip-flop function.

According to an embodiment of the present invention there is provided a circuit including a logic gate configured to operate as an AND gate, the circuit having: a first input; a second input; a third input; a fourth input; and a first output the circuit including: a first simple field effect transistor having a source connected to a first power supply voltage and a drain; a second simple field effect transistor having a source connected to the drain of the first simple field effect transistor and a drain connected to the first output; a first ferroelectric field effect transistor having a source connected to a second power supply voltage, greater than the first power supply voltage, and a drain connected to the first output; and a second ferroelectric field effect transistor having a source connected to the second power supply voltage and a drain connected to the first output.

In one embodiment, the logic gate is further configured to operate as a NAND gate.

In one embodiment, the logic gate is further configured to operate as an OR gate.

In one embodiment, the logic gate is further configured to operate as a NOR gate.

In one embodiment, the circuit includes: a third simple field effect transistor having a source connected to the first power supply voltage and a drain connected to the second output; a fourth simple field effect transistor having a source connected to the first power supply voltage and a drain connected to the second output; a third ferroelectric field effect transistor having a source connected to a second power supply voltage, greater than the first power supply voltage, and a drain; and a fourth ferroelectric field effect transistor having a source connected to the drain of the third ferroelectric field effect transistor and a drain connected to the second output.

According to an embodiment of the present invention there is provided an integrated circuit including: a plurality of field effect transistors, each of the field effect transistors of the integrated circuit having a channel of a first polarity, the plurality of field effect transistors including: a first field effect transistor; and a second field effect transistor, the first field effect transistor being a simple field effect transistor, and the second field effect transistor being a ferroelectric field effect transistor, wherein the integrated circuit includes: a logic gate configured to provide an AND function; and a memory cell configured to provide a data flip-flop function.

BRIEF DESCRIPTION OF THE DRAWINGS

These and other features and advantages of the present invention will be appreciated and understood with reference to the specification, claims, and appended drawings wherein:

FIG. 6A is a schematic diagram of a logic gate, according to an embodiment of the present invention;

FIG. 6B is a schematic diagram of a logic gate, according to an embodiment of the present invention;

FIG. 6C is a symbol for a logic gate, according to an embodiment of the present invention;

FIG. 6D is a truth table of a logic gate, according to an embodiment of the present invention;

FIG. 7A is a schematic diagram of a logic gate, according to an embodiment of the present invention;

FIG. 7B is a schematic diagram of a logic gate, according to an embodiment of the present invention;

FIG. 7C is a symbol for a logic gate, according to an embodiment of the present invention;

FIG. 7D is a truth table of a logic gate, according to an embodiment of the present invention;

FIG. 7E is a pair of equations relating the behavior of logic gates, according to an embodiment of the present invention;

FIG. 8A is a schematic diagram of a logic gate, according to an embodiment of the present invention;

FIG. 8B is a schematic diagram of a logic gate, according to an embodiment of the present invention;

FIG. 8C is a symbol for a logic gate, according to an embodiment of the present invention;

FIG. 8D is a truth table of a logic gate, according to an embodiment of the present invention;

FIG. 9A is a schematic diagram of a logic gate, according to an embodiment of the present invention;

FIG. 9B is a schematic diagram of a logic gate, according to an embodiment of the present invention;

FIG. 9C is a symbol for a logic gate, according to an embodiment of the present invention;

FIG. 9D is a truth table of a logic gate, according to an embodiment of the present invention;

DETAILED DESCRIPTION

The detailed description set forth below in connection with the appended drawings is intended as a description of exemplary embodiments of unipolar complementary logic provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Some embodiments provide a circuit including a combination of one or more ferroelectric field effect transistors and one or more simple field effect transistors. As used herein, a ferroelectric field effect transistor is a field effect transistor that includes a ferroelectric (FE) capacitor in series with the gate. A simple field effect transistor is any field effect transistor that does not include a ferroelectric capacitor in series with the gate; the qualifier "simple" is used herein for field effect transistors lacking a ferroelectric capacitor in series with the gate to distinguish these kinds of transistors from ferroelectric field effect transistors. In some embodiments, each field effect transistor (i.e., each of the ferroelectric field effect transistors and each of the simple field effect transistors) in an integrated circuit may have a channel formed of a semiconductor material, and the polarity of the semiconductor material of the channels of all of the field effect transistors in the integrated circuit may be the same, i.e., all of the channels may be formed of n-type semiconductor material or all of the channels may be formed of p-type semiconductor material.

Figures 1A, 1B:
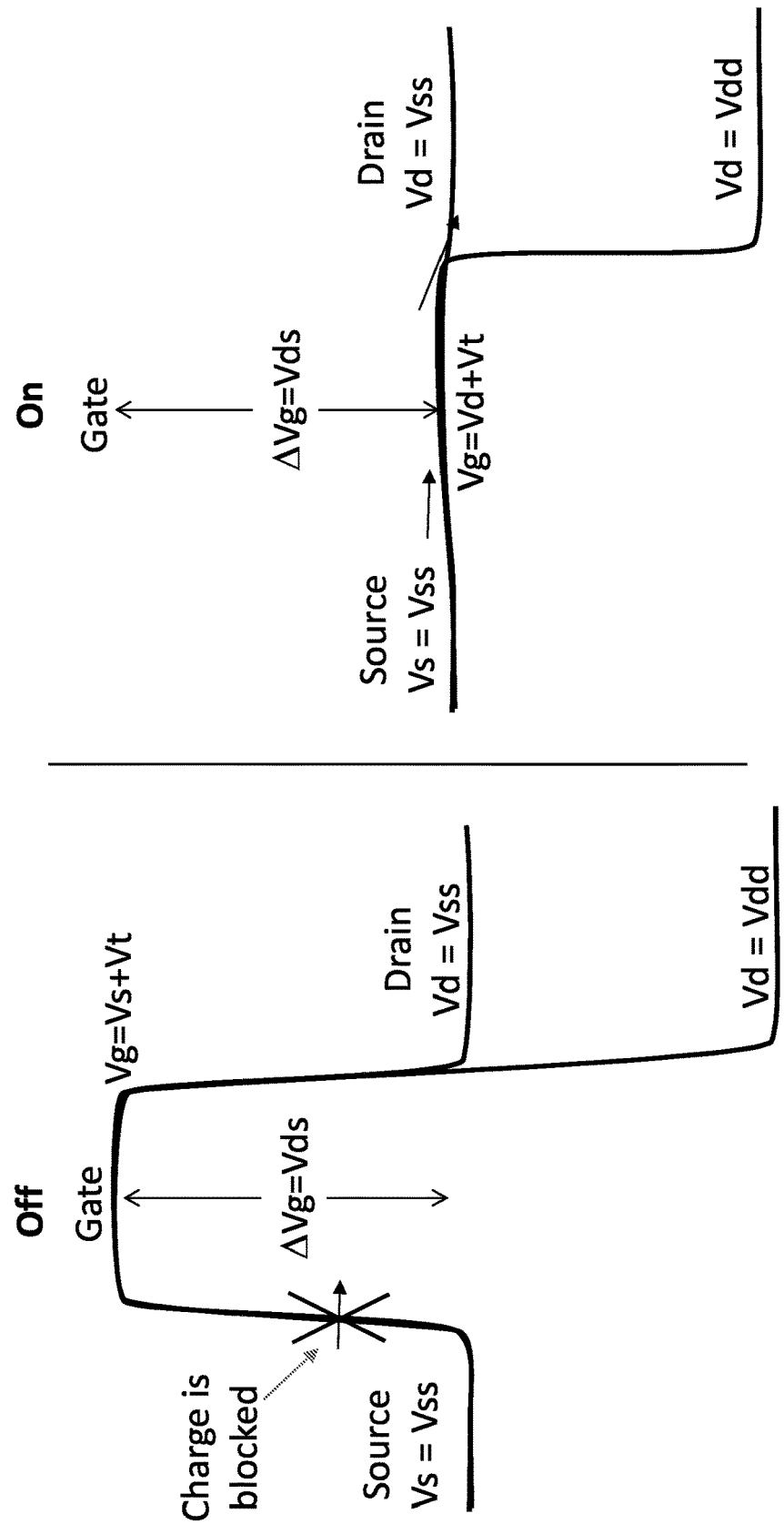
FIG. 1A is a potential diagram of a simple field effect transistor, according to an embodiment of the present invention.
FIG. 1B is a potential diagram of a simple field effect transistor, according to an embodiment of the present invention.
Figures 2A, 2B:
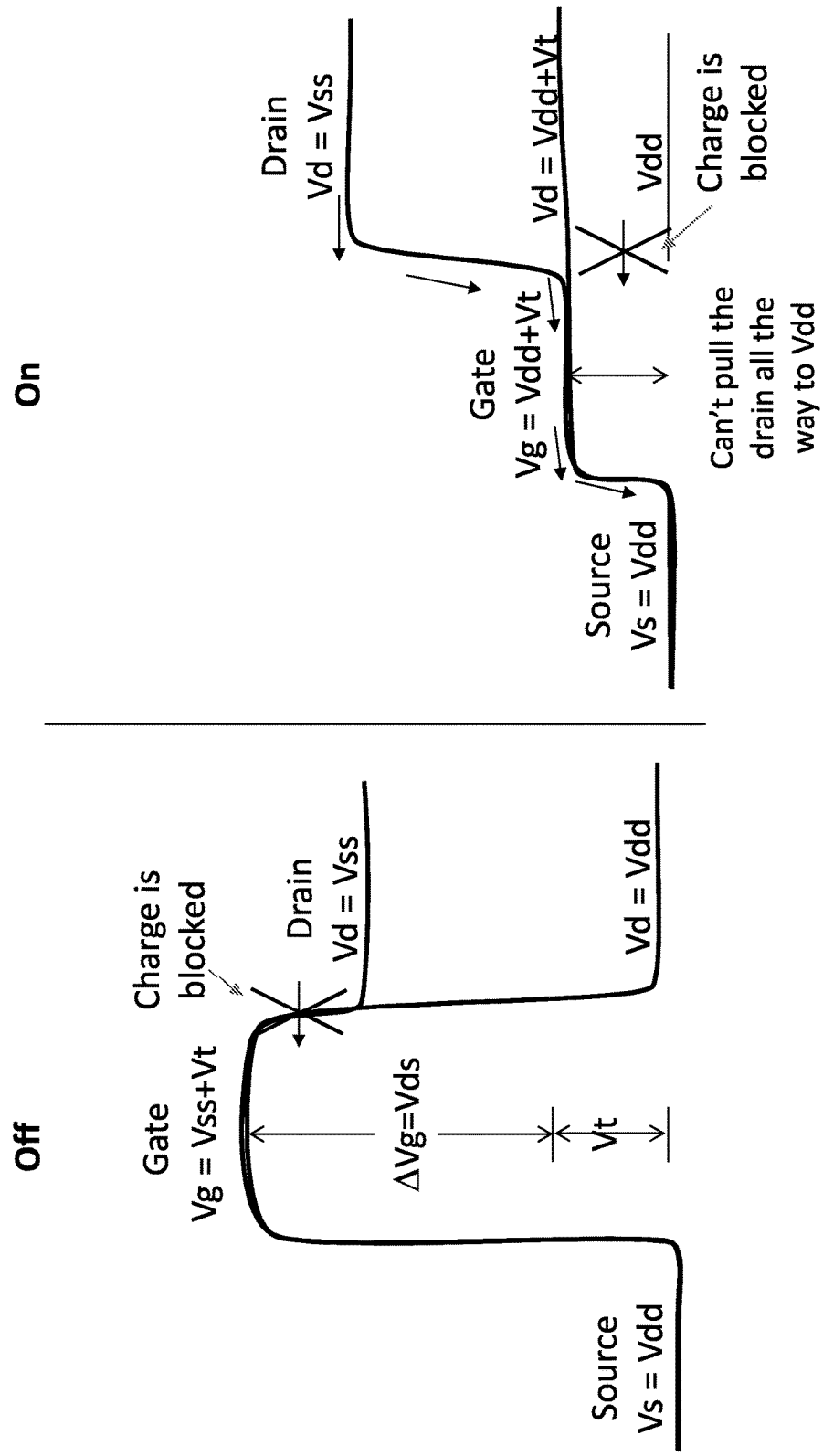
FIG. 2A is a potential diagram of a simple field effect transistor, according to an embodiment of the present invention.
FIG. 2B is a potential diagram of a simple field effect transistor, according to an embodiment of the present invention.

Referring to FIGS. 1A-2B, an n-type simple field effect transistor (i.e., a simple field effect transistor in which the channel material is n-type) may be capable of pulling the drain down (as shown in FIGS. 1A and 1B) but incapable of pulling the drain up (as shown in FIGS. 2A and 2B). For example, referring to FIGS. 1A and 1B, in a n-type simple field effect transistor configured to pull down (i.e., to pull its drain down when turned on), the Vt of the n-type simple field effect transistor may be set so that the device is off when the gate is biased to Vss. When the gate is biased to Vdd, the barrier is lowered and charge flows until the drain is pulled to Vss. However, (as shown in FIGS. 2A and 2B), with that Vt, the device is not able to pull the drain all the way to Vdd once it is on.

Figures 3A, 3B:
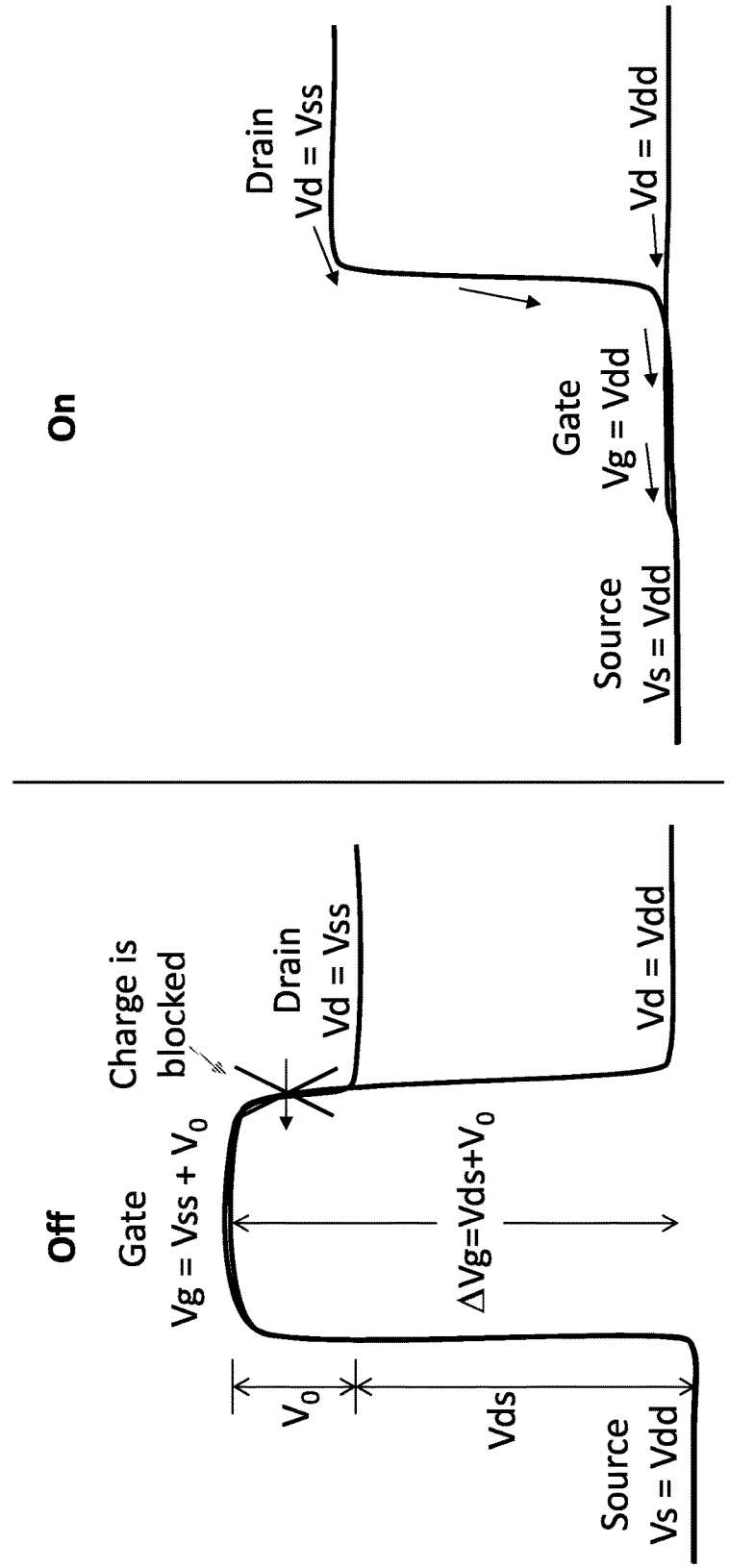
FIG. 3A is a potential diagram of a ferroelectric field effect transistor, according to an embodiment of the present invention.
FIG. 3B is a potential diagram of a ferroelectric field effect transistor, according to an embodiment of the present invention.

Referring to FIGS. 3A and 3B, an n-type ferroelectric field effect transistor may, by contrast, be able to pull the drain down. The ferroelectric field effect transistor enables a bigger effective potential swing on the gate than is applied externally to the gate. This amplification effect is due to the switching of the permanent polarization of a ferroelectric capacitor that is in series with the gate. When the permanent polarization of the ferroelectric capacitor flips, it results in additional boost in the potential applied to the gate. This additional boost can enable the device to both be turned off (for a first value of the externally applied gate voltage) and (for a second value of the externally applied gate voltage) pull the drain all the way to the opposite rail. As such, an n-type ferroelectric field effect transistor may be capable of pulling up, and a p-type ferroelectric field effect transistor may be capable of pulling down. The following equation provides an approximation of the change in gate potential that may be expected from the flipping of the polarization of the ferroelectric capacitor:

$$V_0 \approx (2P_0 A)/C$$

where P0 is the permanent polarization of the ferroelectric material, V0 is the shift in potential on the gate due to flipping of $P_0$, A is the area of the ferroelectric capacitor, and C is the capacitance of the gate. The above equation assumes that the gate capacitance is much smaller than the ferroelectric capacitor and the value of the capacitance in the equation is that of the gate capacitor. The approximation may be reasonable since the dielectric constant (i.e., the relative permittivity) of ferroelectric materials may be significantly larger than that of even high-K gate dielectrics (e.g., PZT may have a dielectric constant greater than 300, whereas Hafnia (HfO2) may have a dielectric constant of about 20-25).

Figures 4A, 4B:
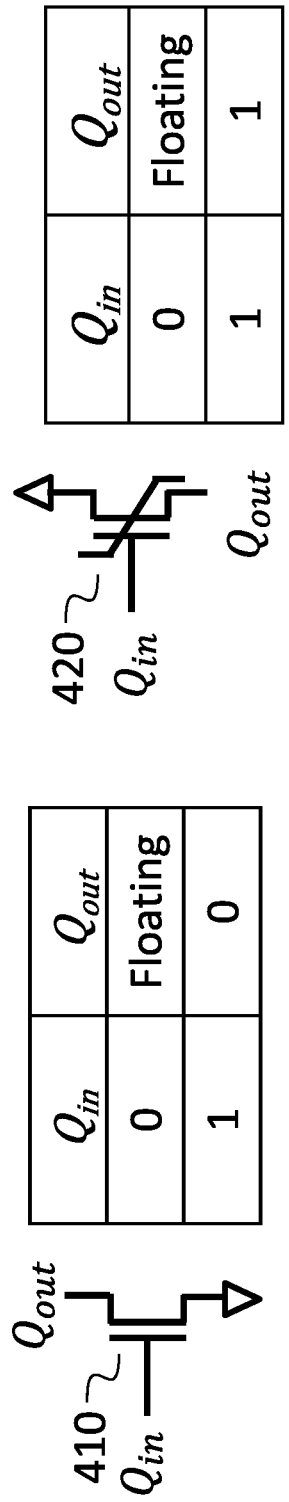
FIG. 4A is a truth table of a simple field effect transistor, according to an embodiment of the present invention.
FIG. 4B is a truth table of a ferroelectric field effect transistor, according to an embodiment of the present invention.

FIG. 4A shows a truth table for an n-type simple field effect transistor 410, with the source connected to ground. When the gate ($Q_{in}$) is high (e.g., at a voltage near the positive supply voltage), the drain ($Q_{out}$) is low, and when the gate is low, the drain floats. FIG. 4B shows a truth table for an n-type ferroelectric field effect transistor 420, with the source connected to the positive supply voltage. When the gate ($Q_{in}$) is high (e.g., at a voltage near the positive supply voltage), the drain ($Q_{out}$) is high, and when the gate is low, the drain floats.

Figures 5A, 5B:
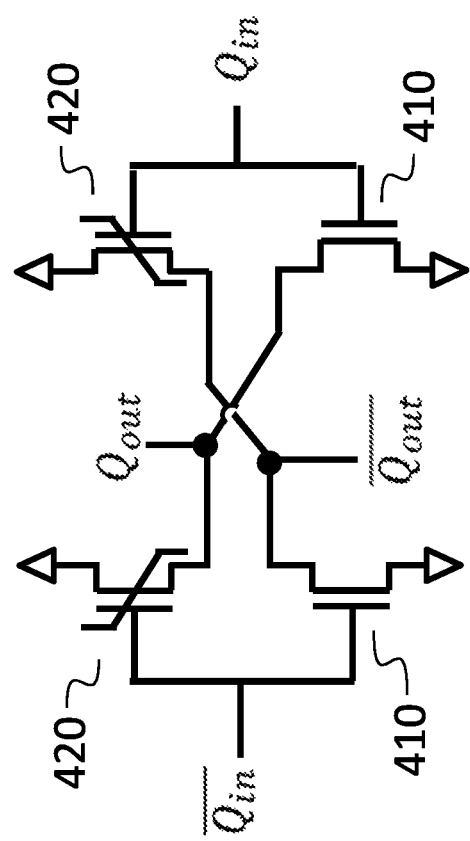
FIG. 5A is a schematic diagram of a logic gate, according to an embodiment of the present invention.
FIG. 5B is a truth table of a logic gate, according to an embodiment of the present invention.

As a result of these characteristics, a buffer-inverter may be constructed, for example, as illustrated in FIG. 5A. This circuit includes four transistors, two simple field effect transistors 410 (each having a source connected to a first power supply voltage, e.g., ground), and two ferroelectric field effect transistors 420 (each having a source connected to a second power supply voltage, greater than the first power supply voltage). The circuit of FIG. 5A has twice as many transistors as a CMOS buffer-inverter, but the circuit receives complementary inputs and produces complementary outputs (symbolized by the overbars over $Q_{in}$ and $Q_{out}$, respectively). A truth table for the circuit of FIG. 5A is shown in FIG. 5B.

Referring to FIGS. 6A-6D, other logic gates, such as the 2-input OR gate illustrated, may also be constructed using combinations of n-type simple field effect transistors 410 and n-type ferroelectric field effect transistor 420, as shown. A first circuit, shown in FIG. 6A, generates an output equal to the OR of the inputs $Q_A$ and $Q_B$, using these two inputs and their respective complements. A second circuit, shown in FIG. 6B, generates an output equal to the complement of the output of the circuit of FIG. 6A, i.e., the complement of the OR of the inputs $Q_A$ and $Q_B$. Together, the circuits of FIGS. 6A and 6B implement a 2-input OR gate with complementary outputs, such as that represented by the symbol of FIG. 6C, the truth table for which is shown in FIG. 6D.

Because the circuits of FIGS. 6A and 6B generate a complementary pair of output signals, the same two circuits may be used to implement a 2-input NOR gate, e.g., by employing the output of the circuit of FIG. 6B (which the generates NOR of the inputs $Q_A$ and $Q_B$) as the output of the (NOR) gate, and employing the output of the circuit of FIG. 6A as the complement of the output of the (NOR) gate. As such, the two circuits of FIGS. 6A and 6B together are configured to provide both an OR function and a NOR function.

Referring to FIGS. 7A-7C, other logic gates, such as the 2-input AND gate illustrated, may also be constructed using combinations of n-type simple field effect transistors 410 and n-type ferroelectric field effect transistor 420. A first circuit shown in FIG. 7A generates an output equal to the AND of the inputs $Q_A$ and $Q_B$, using these two inputs and their respective complements. A second circuit, shown in FIG. 7B, generates an output equal to the complement of the output of the circuit of FIG. 7A, i.e., the complement of the AND of the inputs $Q_A$ and $Q_B$. Together, the circuits of FIGS. 7A and 7B implement a 2-input AND gate with complementary outputs, such as that represented by the symbol of FIG. 7C, the truth table for which is shown in FIG. 7D. The two circuits of FIGS. 7B and 7A are the same as those of FIGS. 6A and 6B, respectively, as a result of De Morgan's laws, as shown in the equations of FIG. 7E. As such, the two circuits of FIGS. 6A and 6B together are further configured to provide an AND function.

The two circuits of FIGS. 7B and 7A may also be used to implement a 2-input NAND gate, e.g., by employing the output of the circuit of FIG. 7B (which generates the NAND of the inputs $Q_A$ and $Q_B$) as the output of the (NAND) gate, and employing the output of the circuit of FIG. 7A as the complement of the output of the (NAND) gate. As such, the two circuits of FIGS. 6A and 6B together are further configured to provide a NAND function.

Referring to FIGS. 8A-8D, in some embodiments a 2-2 AND-OR-invert (AOI) gate may be constructed as illustrated in FIGS. 8A and 8B. The circuit of FIG. 8A generates an output equal to the logical expression on the right hand side of the equation of FIG. 8C, the truth table for which is shown in FIG. 8D. The circuit of FIG. 8B generates an output that is the complement of the output of the circuit of FIG. 8A.

Referring to FIGS. 9A-9D, in some embodiments a 2-2 OR-AND-invert (OAI) gate may be constructed as illustrated in FIGS. 9A and 9B. The circuit of FIG. 9B generates an output equal to the logical expression on the right hand side of the equation of FIG. 9C, the truth table for which is shown in FIG. 9D. The circuit of FIG. 9A generates an output that is the complement of the output of the circuit of FIG. 9B. The two circuits of FIGS. 9B and 9A are the same as those of FIGS. 8A and 8B, respectively, as a result of De Morgan's laws, as shown in the equations of FIG. 7E.

Figure 10:
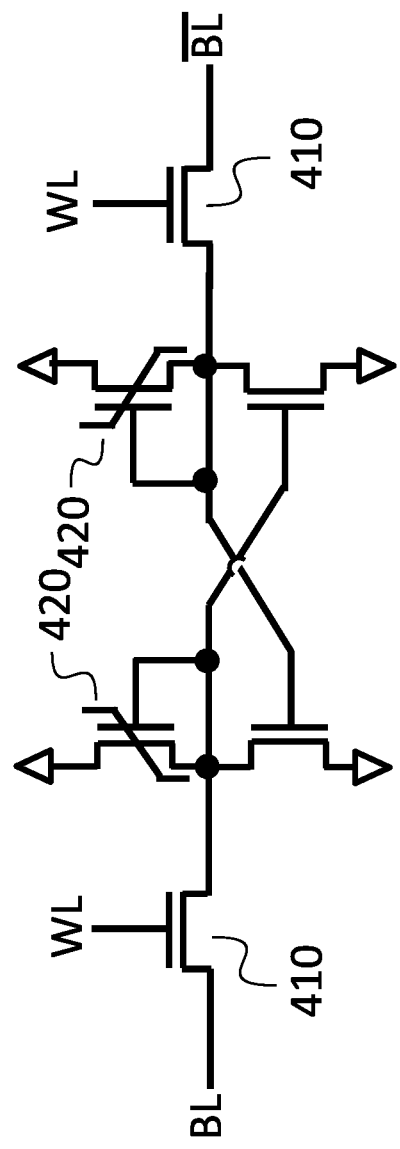
FIG. 10 is a schematic diagram of a memory cell, according to an embodiment of the present invention.

Referring to FIG. 10, in some embodiments a six transistor static random access memory (SRAM) cell may be constructed, with word line (WL) and bit line (BL) connections as shown. This cell has the same size (i.e., six transistors) as a related art CMOS SRAM cell.

Figures 11A, 11B:
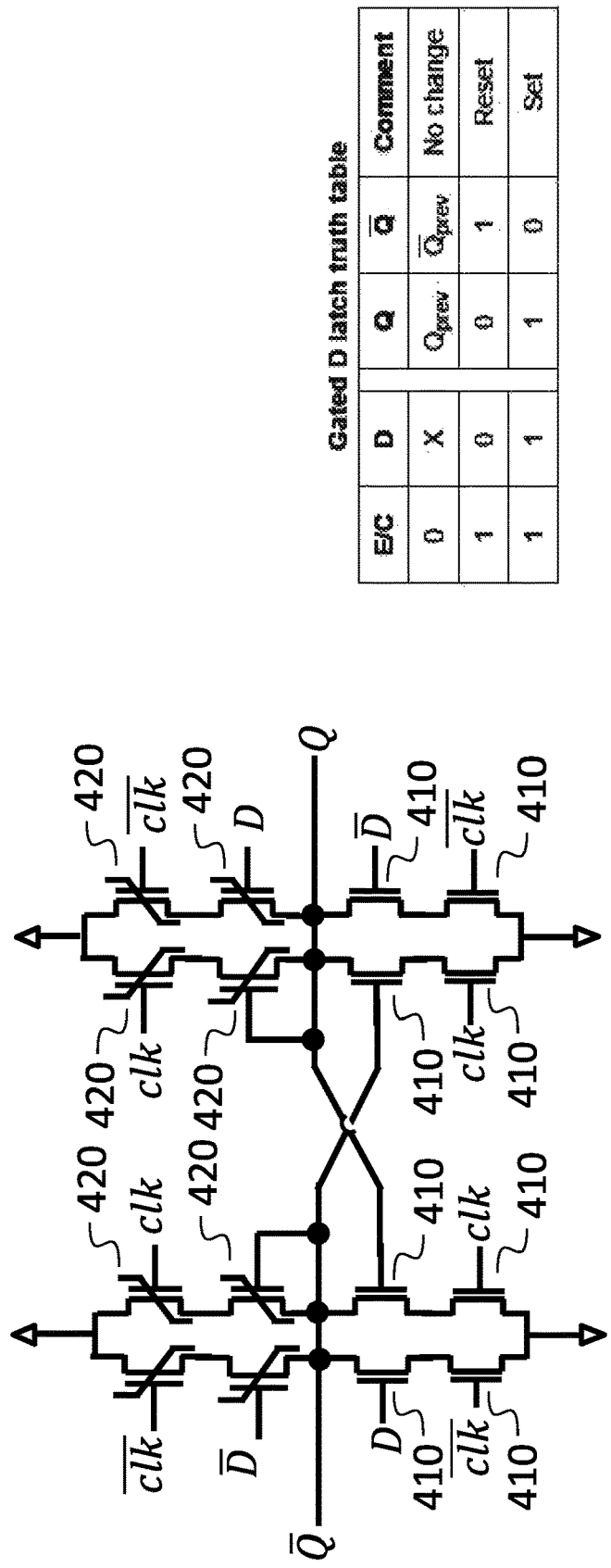
FIG. 11A is a schematic diagram of a memory cell, according to an embodiment of the present invention.
FIG. 11B is a truth table of a memory cell, according to an embodiment of the present invention.

Referring to FIG. 11A, in some embodiments a sixteen transistor data (D) flip-flop (or "gated D-latch") may be constructed, with D inputs (and their complements) and clock inputs (and their complements), and with a Q output and its complement, as shown. The D flip-flop may behave according to the truth table of FIG. 11B.

In view of the foregoing, some embodiments provide a system of unipolar digital logic. Ferroelectric field effect transistors having channels of a first polarity (i.e., channels formed of a semiconductor of the first polarity), are combined, in circuits, with simple field effect transistors having channels of the same polarity, to form logic gates and/or memory cells.

As used herein, a "logic gate" is a digital circuit, the steady-state output signal of which depends only on the signals at the inputs (and not on the history of the signals at the inputs). Examples of logic gates include inverters, AND gates, and OR gates. As used herein, a "memory cell" is a digital circuit the output of which depends on the history of the signals at the inputs. Examples of memory cells include an SRAM cell, and flip-flops (e.g., set-reset (SR) latches, data (D) latches, and J-K flip-flops). It will be understood that analogous circuits to those contained in FIGS. 5A-11A may be constructed using combinations of simple field effect transistors and ferroelectric field effect transistors, all of which are p-type instead of n-type.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of unipolar complementary logic have been specifically described and illustrated herein, many modifications and variations will be apparent to those skilled in the art. Accordingly, it is to be understood that unipolar complementary logic constructed according to principles of this invention may be embodied other than as specifically described herein. The invention is also defined in the following claims, and equivalents thereof.

What is claimed is:

1. An integrated circuit comprising:
a plurality of field effect transistors, each of the field effect transistors of the integrated circuit having a channel of a first polarity, the plurality of field effect transistors comprising:
a first field effect transistor; and
a second field effect transistor,
the first field effect transistor being a simple field effect transistor, and the second field effect transistor being a ferroelectric field effect transistor,
wherein a source of the first field effect transistor is directly connected to a first power supply voltage, and
wherein a source of the second field effect transistor is directly connected to a second power supply voltage, greater than the first power supply voltage.

2. The integrated circuit of claim 1, wherein the channel of the first polarity is an n-type channel.

3. The integrated circuit of claim 1, wherein the channel of the first polarity is an n-type channel.

4. The integrated circuit of claim 1, wherein the integrated circuit comprises a buffer-inverter comprising the first field effect transistor and the second field effect transistor.

5. The integrated circuit of claim 1, wherein the integrated circuit comprises a logic gate configured to provide an AND function.

6. The integrated circuit of claim 5, wherein the logic gate has:
a first input for a first input signal;

a second input for a second input signal;
a third input for an input signal that is a complement of the first input signal; and
a fourth input for an input signal that is a complement of the second input signal.

7. The integrated circuit of claim 5, wherein the logic gate has:
a first output for a first output signal; and
a second output for an output signal that is a complement of the first output signal.

8. The integrated circuit of claim 5, wherein the logic gate is further configured to provide an OR function.

9. The integrated circuit of claim 8, wherein the logic gate is further configured to provide a NOR function.

10. The integrated circuit of claim 1, wherein the integrated circuit comprises a logic gate configured to provide an AND-OR-invert function.

11. The integrated circuit of claim 10, wherein the logic gate is further configured to provide an OR-AND-invert function.

12. The integrated circuit of claim 1, wherein the integrated circuit comprises a memory cell configured to provide a static random access memory cell function.

13. The integrated circuit of claim 1, wherein the integrated circuit comprises a memory cell configured to provide a data flip-flop function.

14. A circuit comprising a logic gate configured to operate as an AND gate, the circuit having:
a first input;
a second input;
a third input;
a fourth input; and
a first output
the circuit comprising:
a first simple field effect transistor having a channel of a first polarity, and a source directly connected to a first power supply voltage and a drain;
a second simple field effect transistor having a source connected to the drain of the first simple field effect transistor and a drain connected to the first output;
a first ferroelectric field effect transistor having a channel of the first polarity, and a source directly connected to a second power supply voltage, greater than the first power supply voltage, and a drain connected to the first output; and
a second ferroelectric field effect transistor having a source connected to the second power supply voltage and a drain connected to the first output.

15. The circuit of claim 14, wherein the logic gate is further configured to operate as a NAND gate.

16. The circuit of claim 15, wherein the logic gate is further configured to operate as an OR gate.

17. The circuit of claim 16, wherein the logic gate is further configured to operate as a NOR gate.

18. The circuit of claim 15, further having a second output, the second output being configured to operate as a complementary AND output or as an output of the NAND gate, the circuit further comprising:
a third simple field effect transistor having a source connected to the first power supply voltage and a drain connected to the second output;
a fourth simple field effect transistor having a source connected to the first power supply voltage and a drain connected to the second output;
a third ferroelectric field effect transistor having a source connected to a second power supply voltage, greater than the first power supply voltage, and a drain; and
a fourth ferroelectric field effect transistor having a source connected to the drain of the third ferroelectric field effect transistor and a drain connected to the second output.

19. An integrated circuit comprising:
a plurality of field effect transistors, each of the field effect transistors of the integrated circuit having a channel of a first polarity, the plurality of field effect transistors comprising:
a first field effect transistor; and
a second field effect transistor,
the first field effect transistor being a simple field effect transistor, and the second field effect transistor being a ferroelectric field effect transistor,
wherein the integrated circuit comprises:
a logic gate configured to provide an AND function; and
a memory cell configured to provide a data flip-flop function,
wherein a source of the first field effect transistor is directly connected to a first power supply voltage, and
wherein a source of the second field effect transistor is directly connected to a second power supply voltage, greater than the first power supply voltage.

* * * * *